United States Patent
Verschueren et al.

(10) Patent No.: US 6,305,283 B1
(45) Date of Patent: Oct. 23, 2001

(54) IMAGING ELEMENT FOR MAKING LITHOGRAPHIC PRINTING PLATES WITH A DECREASED SLIPPAGE IN THE PRESS

(75) Inventors: Eric Verschueren, Merksplas; Willem Cortens, Booischot; Luc Wabbes, Mortsel; Guido Hauquier, Nijlen, all of (BE)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 09/514,146

(22) Filed: Feb. 28, 2000

Related U.S. Application Data
(60) Provisional application No. 60/130,504, filed on Apr. 23, 1999.

(30) Foreign Application Priority Data

Mar. 3, 1999 (EP) .................................... 99200600

(51) Int. Cl.$^7$ ................ B41N 1/14; B41N 6/00
(52) U.S. Cl. ............... 101/453; 101/382.1; 430/271.1
(58) Field of Search .................. 101/453, 460, 101/461, 462, 463.1, 382.1, 401.1, 415.1; 430/271.1, 302, 303

(56) References Cited

U.S. PATENT DOCUMENTS

| | | | |
|---|---|---|---|
| 4,389,476 | * 6/1983 | Whalen-Shaw et al. | 101/463.1 |
| 5,376,518 | * 12/1994 | Jennings et al. | 430/535 |
| 5,445,912 | * 8/1995 | Hauquier et al. | 101/457 |
| 5,639,586 | * 6/1997 | Hauquier et al. | 101/457 |
| 6,176,182 | * 1/2001 | Nakayama et al. | 101/382.1 |

FOREIGN PATENT DOCUMENTS 0 546 195 A1   6/1993   (EP) .
0 564 020 A1   10/1993  (EP) .

OTHER PUBLICATIONS

Patent Abstracts of Japan, vol. 014, No. 35 (p–994), Jan. 23, 1990 & JP 01 271572 A (Mitsubishi Paper Mills Ltd.), Oct. 30, 1989.

Patent Abstracts of Japan, vol. 096, No. 012, Dec. 26, 1996 & JP 08 216542 (Tomoegawa Paper Co. Ltd. ; Fuji Photo Film Co. Ltd.), Aug. 27, 1996.

* cited by examiner

*Primary Examiner*—Stephen R. Funk
(74) *Attorney, Agent, or Firm*—Breiner & Breiner, L.L.C.

(57) ABSTRACT

According to the present invention there is provided an imaging element for making a lithographic printing plate, including on a first side of a flexible support a surface capable of being differentiated in oleophilic and oleophobic areas upon imaging and on a second side opposite to the first side a layer or a package of layers, characterized in that the layer or package of layers on the backside has a ratio of the squared value of the gravimetric water absorption (WA) in g/m$^2$ over the mean roughness in $\mu$m greater than 20.

9 Claims, 1 Drawing Sheet

IMAGING ELEMENT FOR MAKING LITHOGRAPHIC PRINTING PLATES WITH A DECREASED SLIPPAGE IN THE PRESS

RELATED APPLICATION

The application claims benefit of U.S. Provisional Application No. 60/130,504 filed Apr. 23, 1999.

FIELD OF INVENTION

The present invention relates to a lithographic printing plate. More specifically the invention is related to a lithographic printing plate with decreased slippage on the press.

BACKGROUND OF THE INVENTION

Lithographic printing is the process of printing from specially prepared surfaces, some areas of which are capable of accepting ink (oleophilic areas) whereas other areas will not accept ink (oleophobic areas). The oleophilic areas form the printing areas while the oleophobic areas form the background areas.

Two basic types of lithographic printing plates are known. According to a first type, so called wet printing plates, both water or an aqueous dampening liquid and ink are applied to the plate surface that contains hydrophilic and hydrophobic areas. The hydrophilic areas will be soaked with water or the dampening liquid and are thereby rendered oleophobic while the hydrophobic areas will accept the ink. A second type of lithographic printing plates operates without the use of a dampening liquid and are called driographic printing plates. This type of printing plate comprises highly ink repellant areas and oleophilic areas. Generally the highly ink repellant areas are formed by a silicon layer.

Lithographic printing plates can be prepared using a photosensitive lithographic printing plate precursor, also called imaging element. Such imaging element is exposed in accordance with the image data and is generally developed thereafter so that a differentiation results in ink accepting properties between the exposed and unexposed areas.

Examples of photosensitive lithographic printing plate precursors are for example the silver salt diffusion transfer (hereinafter DTR) materials disclosed in EP-A-410 500, EP-A-483 415, EP-A-423 399, imaging elements having a photosensitive layer containing diazonium salts or a diazo resin as described in e.g. EP-A-450 199, imaging elements having a photosensitive layer containing a photopolymerizable composition as described in e.g. EP-A-502 562, EP-A-491 457, EP-A-503 602, EP-A-471 483 or DE-A-4 102 173.

Alternatively a lithographic printing plate may be prepared from a heat mode recording material as a lithographic printing plate precursor. Upon application of a heat pattern in accordance with image data and optional development the surface of such heat mode recording material may be differentiated in ink accepting and ink repellant areas. The heat pattern may be caused by a direct heating source such as a thermal head but may also be caused by a light source as e.g. a laser. In the latter case the heat mode recording material will include a substance capable of converting the light into heat. Heat mode recording materials that can be used for making a lithographic printing plate precursor are described in e.g. EP-A-685 333, DE-A-2 512 038, FR-A-1 473 751, Research Disclosure 19201 of April 1980 or Research Disclosure 33303 of January 1992.

As support for the above mentioned lithographic printing plates there are known metal support such as e.g. aluminum and flexible supports such as e.g. paper or polyester film supports. Generally the flexible supports are used for short run jobs where they have a cost advantage over metal supports. Furthermore, if a transparent flexible support is used exposure of the lithographic printing plate precursor may proceed through the support which allows the use of cameras without special optics.

A disadvantage of the use of flexible supported lithographic printing plates is however the inherently low dimensional stability which is one cause which limits the printing endurance of the printing plate especially when two or more images need to be printed over each other in register such as e.g. in color printing. Attempts have therefore been made to increase the dimensional stability of a flexible supported printing plate by e.g. using a thicker flexible support. Although this brings some improvement, there is still a need for further improvement. Furthermore, the use of a thicker support may cause problems in some processing equipment used for processing the printing plate precursor. Printing with plates with a flexible support happens mostly on low quality presses. However, on these presses is often plate slippage (the slip out of the clamp) the limiting factor. In most cases this is due to a limitation of the clamping system. Mostly these presses are equipped for the processing of paper plates and less suited for plates with a plastic base. Because flexible, non-paper-based printing plates have many advantages, more and more printing plates with a plastic base are used.

In JP-236 692/63 (Kokai) it has been proposed to adhere the flexible support of the printing plate to a metallic plate using a hot-melt adhesive. This method is cumbersome and does no longer present a cost advantage over the use of a lithographic printing plate precursor having a metal support.

EP-A-644 064 discloses a lithographic printing plate precursor comprising on a first side of a flexible support a surface capable of being differentiated in oleophilic and oleophobic areas upon imaging and on a second side opposite to said first side a layer comprising micro-particles of pressure-sensitive adhesive covered with a protective stripping layer. The production of said material is a cumbersome and costly process.

OBJECTS OF THE INVENTION

It is an object of the present invention to provide an imaging element for making a lithographic printing plate with an improved dimensional stability.

It is a further object of the present invention to provide an imaging element for making a lithographic printing plate with a decreased plate slippage.

Still further objects of the present invention will become clear from the description hereinafter.

SUMMARY OF THE INVENTION

According to the present invention there is provided an imaging element for making a lithographic printing plate, comprising on a first side of a flexible support a surface capable of being differentiated in oleophilic and oleophobic areas upon imaging and on a second side opposite to said first side a layer or a package of layers, characterized in that said layer or package of layers on the backside has a ratio of the squared value of the gravimetric water absorption (WA) in $g/m^2$ over the mean roughness in $\mu m$ greater than 20.

DETAILED DESCRIPTION OF THE DRAWING

Figure 1:
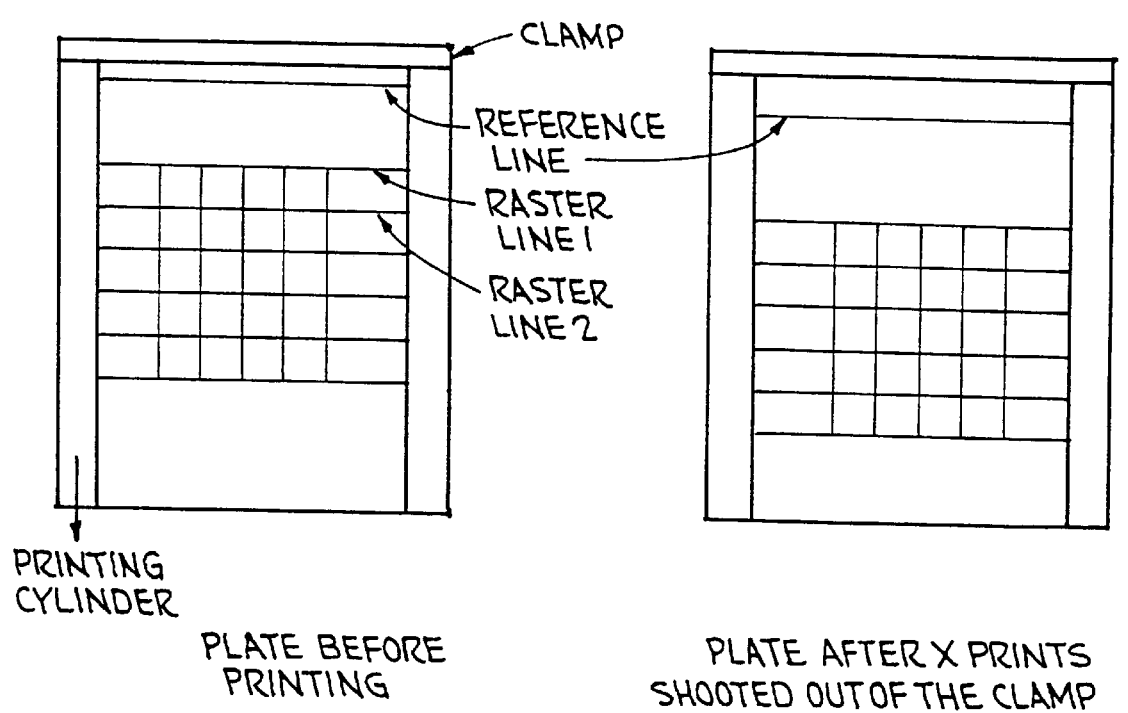
FIG. 1 shows a plate before printing and the plate after X prints with reference line and raster lines to allow analysis of the image to determine slippage.

The profile of a layer is measured with a perthometer MAHR PERTHEN S6P containing as measuring head RTK 50 (trade names of Feinpruef Perthen GmbH, Goettingen, Germany) equipped with a diamond stylus with a diameter of 5 mm under a pressure of 1.0 mN according to techniques well known in the art.

The sampling length Ls which is the reference length for roughness evaluation measures 0.25 mm. The evaluation length Lm, being that part of the traversing length Lt which is evaluated for acquiring the roughness profile R contains standard 5 consecutive sampling lengths. The traversing length Lt is the overall length traveled by the tracing system when acquiring the roughness profile. The average roughness Ra is the measured roughness averaged over the evaluation length Lm.

The mean roughness Ra of the layer or package of layers on the second side of the flexible support ranges preferably between 0.03 $\mu$m and 1 $\mu$m, more preferably between 0.05 $\mu$m and 0.80 $\mu$m.

The swelling of the layer or package of layers on the second side of the flexible support (the back side) is determined by its water absorption. The applied measuring method is based on gravimetry of the swollen layer with a well defined surface plane. In this method a piece of 10.0×10.0 cm is punched and weighed after equilibration on 22° C./50% RH. Then the punch is dipped into distilled water at 22° C. for 2 minutes. The excess of water is wiped off by transporting the punch between 2 rollers with calibrated stress between. Then the weight of the punch is determined again. From the weight difference, the gravimetric water absorption can be calculated in $g/m^2$.

To determine the gravimetric water absorption of the backing side alone, first of all the water absorption of a material without backing layer has to be determined to use this value in the calculation since this determination is always a summation of both sides.

The value of the water absorption of the layer or layer package on the back side of the flexible support ranges preferably between 1.5 and 15 $g/m^2$, more preferably between 2 and 10 $g/m^2$.

According to the invention, the squared value of the gravimetric water absorption (WA) in $g/m^2$ over the mean roughness in $\mu$m is greater than 20, preferably greater than 30.

The second or back side of the support is coated with a layer or a package of layers which is hydrophilic and swellable in water. Said layer or layers comprise a hardened hydrophilic binder.

As hydrophilic binder there may be used hydrophilic (copolymers or mixtures such as for example, homopolymers and copolymers of vinyl alcohol, polyvinyl acetal, acrylamide/acrylic acid copolymer, styrene/acrylic acid copolymer, ethylenevinyl-acetate copolymer, vinylmethyl ether/maleic acid copolymer, poly(2-acrylamido-2-methyl propane sulfonic acid), cellulose and chemical modifications from cellulose, alkylcellulose, hydroxy-alkylcelluloses, carrageenan, xanthan gum, poly(diethylene triamino-co-adipic acid), polyvinyl pyridine, polyvinylimidazole, polyimidazoline quaternized, polyethyleneimine epichlorohydrin-modified, polyethyleneimine ethoxylated, polyurethane, melamine resins, starch and modifications, polyacrylamide, gum agar, polyacrylacids and homologs, polyethyleneoxides, polyethylene-glycols, gum arabic, pectins, locust bean gum, dextranes, polysaccharides, epoxy resins, urea resins, casein, albumin, collagen derivates, gelatin, colloidon, polyvinyl pyrrolidone. The hydrophilicity of the (copolymer or (co)polymer mixture used is preferably the same as or higher than the hydrophilicity of polyvinyl acetate hydrolyzed to at least an extent of 60 percent by weight, preferably 80 percent by weight.

The degree of water absorption is related to the dry layer thickness of the coating. On the other hand, the swelling is regulated by the intrinsic swelling pressure of the formulation of the coating. Aside from the nature of the hydrophilic agent said intrinsic swelling pressure is influenced by the degree of crosslinking. The degree of crosslinking is influenced by the nature and degree of hardeners, the curing temperature. Hardening agents can be used individually or in combination and in a free or a blocked form.

Examples of suitable hardeners are aldehydes such as e.g. formaldehyde, dialdehydes such as e.g. succinaldehyde and glutyraldehyde, blocked dialdehydes, active esters, sulfonate esters, s-triazines, diazines, active halogen compounds, epoxides, active olefins having two or more active bonds, active olefins, carbodiimides, isoxazolium salts unsubstituted in the 3-position, esters of 2-alkoxy-N-carboxydihydroquinolone, N-carbamoyl and N-carbamoypyridinium salts, hardeners of mixed function such as halogen-substituted aldehyde acids, onium substituted acroleins and vinyl sulphones, polymeric hardeners, such as dialdehyde starches and copoly(acroleinmethacrylic acid).

By incorporation in the hardened hydrophilic layer of particulate materials, the roughness can be regulated. This particulate material may consist either of primary particles comprising single particles or of porous particles comprising secondary particles formed from aggregation of the primary particles. These particles can be porous. To regulate the roughness, the particles can be used individually or by combination of different types. These particles have an average particle size of 0.5 to 30 $\mu$m, which can be formed by aggregation of smaller particles, having a size of 0.01 to 2 $\mu$m. These particles are preferably made of at least one of the organic materials such as polystyrene, polymethacrylate, polymethylmethacrylate, elastomers, ethylene-vinyl acetate copolymers, polyesters, polyester-copolymers, polyacrylate polyvinylethers, poly(methyl)styrene, polyamides, polyolefines, polysilicones, guanamine resins, polytetrafluoroethylenes, styrene-butadiene rubber, NBR, urea resins, urea formalin resins, . . . or inorganic materials such as synthetic silica, talc, clay, kaolin, diatomite earth, calcium carbonate, magnesium carbonate, aluminum hydroxide, aluminum oxide, titanium oxide, zinc oxide, barium sulphate, carbon black, calcium sulphate, zinc sulfide, satin white, aluminum silicate, calcium silicate.

Said cross-linked hydrophilic layer may contain pigments or dyes. Furtheron, said layer may contain surfactants, more preferably non-ionic or anionic surfactants.

When said back side of the imaging element is coated with a package of layers, said package can be coated in different coating processes or preferably in one operation.

The flexible support can be transparent or opaque. Said support can be paper, preferably coated on both sides with polyethylene or more preferably a plastic such as polyethylene terephthalate, polyethylene naphthalate, polyethylenephenyl sulphon, polyimide, polystyrene, polyethylene and polypropylene.

The surface layer of the imaging element can be imaged in oleophilic and oleophobic areas by methods know to those skilled in the art. In one way, the method is by irradiation with actinic light. In another way, the method is by heat mode or by a thermal head. In still another way, the method is by ink jet. In still another way, the method is by electrography, ionography, magnetography and xerography, yielding a toner on the surface layer. In still another way, the method is by printing. In still other ways it is by thermosublimation, thermal transfer, laser ablation transfer, thermal ablation thermal transfer, laser transfer printing, pen plotter, manual writing and other image forming methods.

After imaging, possibly enclosing a development step, the backing layer or package of layers of the imaged element is preferably moistened. A moistened image sensitive material has a decreased slippage against a non-moistened element, although also a non-moistened element according to the invention shows a decreased slippage compared with an imaging element not corresponding to the invention. This moistening can be carried out in different ways.

In a first way, the printing cylinder or the back layer or both are moistened. In another way, the plate is moistened in a processor. In still another way, when automatic plate-loading is effected, the plate is moistened by transport through an etch liquid container, filled with a liquid or by using spraying nozzles, mounted between the stock container and the printing cylinder or by using an increased relative humidity or by each method whereby the back layer or package of layers or the printing cylinder is moistened.

This invention has a great advantage over the use of a permanent adhesive layer. In the case of a permanent adhesive layer, one has to use a protective sheet, which is cumbersome during the production and costly. By the use of the present invention there is obtained a material that in dry condition does not act as an adhesive, but becomes an adhesive only by moistening the back layer or package of layers.

EXAMPLE 1 COMPARATIVE EXAMPLE

Backing Layer:

A 0.100 mm thick polyester foil was coated with a backing layer from a 23.6% wt aqueous solution adjusted to pH 4, with a wet coating thickness of 50 $\mu$m. This layer was, after chilling for 30 seconds at 10° C., dried on a temperature of 50° C. with a moisture content of the air of 4 g/m$^3$ for at least 3 minutes. The resulting backing layer contained 9040 mg/m$^2$ TiO$_2$, 900 mg/m$^2$ SiO$_2$, 990 mg/m$^2$ polyvinylalcohol, 23.6 mg/m$^2$ of AKYPO OP-8O, 0.25 mg/m$^2$ of a nonionic perfluoroalkyl surfactant.

TiO$_2$ with average particle size between 0.3 and 0.5 $\mu$m was used. The used type of polyvinylalcohol is hydrolyzed polyvinylacetate, commercially available at Wacker Chemie GmbH, F.R. Germany, under the trademark POLYVIOL WX. The SiO$_2$ indicated above is added as a dispersion of hydrolyzed tetramethoxysilane to the dispersion. AKYPO OP-8O is a surfactant, commercially available at Chemy. For the TiO$_2$, BAYERTITAN RKB2, commercially available at Bayer, was used.

Receiving Layer:

On the opposite side, the receiving layer was coated from a 23.6% wt aqueous solution adjusted to pH 4, with a wet coating thickness of 50 $\mu$m. This layer was, after chilling for 30 seconds at 10° C., dried on a temperature of 50° C. with a moisture content of the air of 4 g/m$^3$ for at least 3 minutes. The resulting image receiving layer contained 9040 mg/m$^2$ TiO$_2$, 900 mg/m$^2$ SiO$_2$, 990 mg/m$^2$ polyvinylalcohol, 250 mg/m$^2$ of MYLBOND 211, 23.6 mg/m$^2$ of AKYPO OP-80, 0.25 mg/m$^2$ of a non-ionic perfluoroalkyl surfactant.

In advance to the preparation of the coating solution a dispersion is made comprising the above mentioned TiO2, SiO$_2$ and polyvinylalcohol. Also the MYLBOND 211 is dispersed in a 3% solution of the mentioned polyvinylalcohol.

MYLBOND 211 is a chemical treated starch, with a average particle size of 21 $\mu$m, commercially available at Amylum. For the TiO$_2$, BAYERTITAN RKB2, commercially available at Bayer, was used.

EXAMPLE 2

Backing Layer:

A 0.100 mm thick polyester foil was coated with a 3-layered backing package. A total thickness of 42.3 m was coated resulting in a layer containing 2.13 g/m$^2$ of gelatin, 14.4 mg/m2 of formaldehyde, 7 mg/m$^2$ of TERGITOL 4, 240 mg/m$^2$ of Helioechtschwarz AG, 1.16 g/m$^2$ of a polyethylacrylate latex with a molecular weight of 10000, 74.8 mg/m$^2$ SAPONIN, 0.044 g/m$^2$ of 1,3,5-triacrylonyl-perhydro-S-triazin, 2.67 g/m$^2$ TiO$_2$, 2.65 mg/m2 of a nonionic perfluoroalkyl surfactant and 5.2 mg/m$^2$ of SODEVCLEAN.

The first layer contains no binder, since it only functions as a coatability improvement. The second layer contains 71% of the total binder amount. Additionally 82% of the polyethylacrylate latex with a molecular weight of 10000 and the Helioechtscharz AG was incorporated in this layer. The TiO$_2$ and surfactants were incorporated in the third layer together with the resulting gelatin and the polyethylacrylate latex with a molecular weight of 10000.

To obtain the preferred swelling characteristics, the first layer was adjusted to pH 5.6, the second to 5.4 and the third layer to pH 5.4. After coating, the layer package was chilled for 15 seconds at 5° C., dried on a temperature of 45° C. for at least 4 minutes.

For the TiO$_2$, BAYERTITAN RKB2, commercially available at Bayer, was used. TERGITOL 4 is an anionic surfactant, commercially available at Union Carbide. Helioechtschwarz AG is a carbon black with an average particle size of 150–250 $\mu$m. Prior to addition to the coating solution, a dispersion is made with a part of the gelatin used in the coating solution.

Helioechtschwarz AG is commercially available at BASF. SAPONIN is a nonionic surfactant mixture consisting of esters and polyglycosides, commercially available at Merck. 1,3,5-triacrylonyl-perhydro-S-triazin is used as a hardening catalyst, commercially available at PCAS. SODEVCLEAN is a mixture of surfactants, commercially available at SPECHIM.

Receiving Layer:

The same layer as in example 1 was applied.

EXAMPLE 3

Backing Layer:

A 0.100 mm thick polyester foil was coated with a backing layer at a thickness of 60 $\mu$m. This layer was, after chilling for 30 seconds at 10° C., dried on a temperature of 45° C. for at least 4 minutes. The resulting backing layer contained 2.52 g/m$^2$ of gelatin, 34.7 mg/m$^2$ of polymethylmethacrylate, 10.8 mg/m$^2$ of co-(polystyrenepolymaleic acid-methylmethacrylate-stearylmethacrylate)polymer, 16.2 mg/m$^2$ of TERGITOL 4, 4.2 mg/m$^2$ of FC126, 0.58 g/m$^2$ of SiO$_2$, 86.4 mg/m$^2$ of formaldehyde. The pH of this solution was adjusted to pH 5.4.

The gelatin in this and the other examples except example 5 is a high molecular weight gelatin with a fraction of microgels (>450,000 Dalton) between 20 and 25% w/w. The polymethylmethacrylate is an entpolymer of styrene, maleic acid and methylmethacrylate, used as a dispersion in water.

The average particle size is between 2.8 and 3.4 am. TERGITOL 4 is a anionic surfactant, commercially available at Union Carbide. FC126 is an anionic fluorosurfactant, commercially available at 3M. The co-(polystyrene-polymaleic acid-methylmethacrylate-stearylmethacrylate) polymer particles have an average diameter of 5 to 6.6 $\mu$m. Before adding to the coating solution, a dispersion of these particles is made in gelatin. As $SiO_2$, KIESELSOL 300F is used, commercially available at Bayer.

Receiving Layer:
The same layer as in example 1 was applied.

EXAMPLE 4

Backing Layer:
A 0.100 mm thick polyester foil was coated with a backing layer at a thickness of 60 $\mu$m. This layer was, after chilling for 30 seconds at 10° C., dried on a temperature of 45° C. for at least 4 minutes.

The resulting backing layer contained 2.52 g/m$^2$ of gelatin, 0.58 g/m$^2$ of $SiO_2$, 34.7 mg/m$^2$ of polymethylmethacrylate, 10.8 mg/m$^2$ of co-(polystyrene-polymaleic acid-methylmethacrylate-stearylmethacrylate) polymer, 16.2 mg/m$^2$ of TERGITOL 4, 4.2 mg/m$^2$ of FC126, 86.4 mg/m$^2$ of formaldehyde, 120 mg/m$^2$ of $BaSO_4$, 48.8 mg/m$^2$ of 1,3,5-triacrylonyl-perhydro-S-triazin. The pH of this solution was adjusted to pH 5.4.

The polymethylmethacrylate is a entpolymer of styrene, maleic acid and methylmethacrylate, used as a dispersion in water. The average particle size is between 2.8 and 3.4 $\mu$m. TERGITOL 4 is an anionic surfactant, commercially available at Union Carbide. FC126 is an anionic fluorosurfactant, commercially available at 3M. 1,3,5-triacrylonyl-perhydro-S-triazin is used as a hardening catalyst, commercially available at PCAS. The co-(polystyrene-polymaleic acid-methylmethacrylate-stearylmethacrylate)polymer particles have an average diameter of 5 to 6.6 $\mu$m. Before adding to the coating solution, a dispersion of these particles is made in gelatin. As $SiO_2$, KIESELSOL 300F is used, commercially available at Bayer. $BaSO_4$ is commercially available at Sachtleben Chemie GmbH.

Receiving Layer:
The same layer as in example 1 was applied.

EXAMPLE 5

Backing Layer:
A 0.100 mm thick polyester foil was coated with a backing layer at a thickness of 60 $\mu$m. This layer was, after chilling for 30 seconds at 10° C., dried on a temperature of 45° C. for at least 4 minutes.

The resulting backing layer contained 2.52 g/m$^2$ of gelatin, 34.7 mg/m$^2$ of polymethylmethacrylate, 10.8 mg/m$^2$ of co-(polystyrene-polymaleic acid-methylmethacrylate-stearylmethacrylate)polymer, 16.2 mg/m$^2$ of TERGITOL 4, 4.2 mg/m$^2$ of FC126, 0.58 g/m$^2$ of $SiO_2$, 86.4 mg/m$^2$ of formaldehyde, 120 mg/m$^2$ of $BaSO_4$, 48.8 mg/m$^2$ of 1,3,5-triacrylonyl-perhydro-S-triazin. The pH of this solution was adjusted to pH 5.4.

The gelatin used is a lower viscosity type, with a fraction of microgels (>450,000 Dalton) of about 8–13% w/w. The polymethylmethacrylate is an entpolymer of styrene, maleic acid and methylmethacrylate, used as a dispersion in water. The average particle size is between 2.8 and 3.4 $\mu$m. TERGITOL 4 is an anionic surfactant, commercially available at Union Carbide. FC126 is an anionic fluorosurfactant, commercially available at 3M. 1,3,5-triacrylonyl-perhydro-S-triazin is used as a hardening catalyst, commercially available at PCAS. The co-(polystyrene-polymaleic acid-methylmethacrylate-stearylmethacrylate)polymer particles have an average diameter of 5 to 6.6 $\mu$m. Before adding to the coating solution, a dispersion of these particles is made in gelatin. As $SiO_2$, KIESELSOL 300F is used, commercially available at Bayer. $BaSO_4$ is commercially available at Sachtleben Chemie GmbH.

Receiving Layer:
The same layer as in example 1 was applied.

EXAMPLE 6

Backing Layer:
A 0.100 mm thick polyester foil was coated with a 3-layered backing package. A total thickness of 42.3 $\mu$m was coated resulting in a layer package containing 2.13 g/m$^2$ of gelatin, 14.4 mg/m$^2$ of formaldehyde, 7 mg/m$^2$ of TERGITOL 4, 240 mg/m$^2$ of Helioechtschwarz AG, 0.348 g of SYLOID 378, 74.8 mg/m$^2$ SAPONIN, 0.044 g/m$^2$ of 1,3,5-triacrylonyl-perhydro-S-triazin, 2.67 g/m$^2$ $TiO_2$, 2.65 mg/m$^2$ of a non-ionic perfluoroalkyl surfactant and 5.2 mg/m$^2$ of SODEVCLEAN. The first layer contains no binder, since it only functions as a coatability improvement. The second layer contains 71% of the total binder amount. Additionally 82% of the Helioechtschwarz AG was incorporated in this layer. The $TiO_2$ and surfactants were incorporated in the third layer together with the resulting gelatin and Helioechtschwarz AG.

To obtain the preferred swelling characteristics, the first layer was adjusted to pH 5.6, the second to 5.4 and the third layer to pH 5.4. After coating, the package was chilled for 15 seconds at 5° C., dried on a temperature of 45° C. for at least 4 minutes. For the $TiO_2$ BAYERTITAN RKB2, commercially available at Bayer, was used. TERGITOL 4 is an anionic surfactant, commercially available at Union Carbide. Helioechtschwarz AG is a carbon black with an average particle size of 150–250 $\mu$m. Prior to addition to the coating solution, a dispersion is made with a part of the gelatin used in the coating solution.

Helioechtschwarz AG is commercially available at BASF. SAPONIN is a nonionic surfactant mixture consisting of esters and polyglycosides, commercially available at Merck. 1,3,5-triacrylonyl-perhydro-S-triazin is used as a hardening catalyst, commercially available at PCAS. SODEVCLEAN is mixture of surfactants, commercially available at SPECHIM.

Receiving Layer:
The same layer as in example 1 was applied.

EXAMPLE 7

Backing Layer:
A 0.100 mm thick polyester foil was coated with a 3-layered backing package. A total thickness of 42.3 $\mu$m was coated resulting in a package containing 2.13 g/m$^2$ of gelatin, 14.4 mg/m$^2$ of formaldehyde, 7 mg/m$^2$ of TERGITOL 4, 240 mg/m$^2$ of Helioechtschwarz AG, 100 mg/m$^2$ of MYLBOND 211, 74.8 mg/m$^2$ SAPONIN, 0.044 g/m$^2$ of 1,3,5-triacrylonyl-perhydro-S-triazin, 2.67 g/m$^2$ $TiO_2$, 2.65 mg/m$^2$ of a non-ionic perfluoroalkyl surfactant and 5.2 mg/m$^2$ of SODEVCLEAN. The first layer contains no binder, since it only functions as a coatability improvement. The second layer contains 71% of the total binder amount. Additionally 82% of the Helioechtschwarz AG was incorporated in this layer. The $TiO_2$ and surfactants were incorporated in the third layer together with the resulting gelatin and Helioechtscharz AG.

To obtain the preferred swelling characteristics, the first layer was adjusted to pH 5.6, the second to 5.4 and the third layer to pH 5.4. After coating, the package was chilled for 15 seconds at 50° C., dried on a temperature of 45° C. for at least 4 minutes. For the $TiO_2$, BAYERTITAN RKB2, commercially available at Bayer, was used. TERGITOL 4 is an anionic surfactant, commercially available at Union Carbide. Helioechtschwarz AG is a carbon black with an average particle size of 150–250 $\mu$m. Prior to addition to the coating solution, a dispersion is made with a part of the gelatin used in the coating solution.

Helioechtschwarz AG is commercially available at BASF. MYLBOND 211 is a chemical treated starch, with a average particle size of 21 $\mu$m, commercially available at Amylum. SAPONIN is a nonionic surfactant mixture consisting of esters and polyglycosides, commercially available at Merck. 1,3,5-triacrylonyl-perhydro-S-triazin is used as a hardening catalyst, commercially available at PCAS. SODEVCLEAN is a mixture of surfactants, commercially available at SPECHIM.

Receiving Layer:

The same layer as in example 1 was applied.

EXAMPLE 8

Backing Layer:

A 0.100 mm thick polyester foil was coated with a 3-layered backing package. A total thickness of 42.3 $\mu$m was coated resulting in a package containing 2.13 g/m$^2$ of gelatin, 14.4 mg/m$^2$ of formaldehyde, 7 mg/m$^2$ of TERGITOL 4, 240 mg/m$^2$ of Helioechtschwarz AG, 0.35 g/m$^2$ SYLOID 378, 74.8 mg/m$^2$ SAPONIN, 0.044 g/m$^2$ of 1,3,5-triacrylonyl-perhydro-S-triazin, 2.67 g/m$^2$ TiO$_2$, 2.65 mg/m$^2$ of a non-ionic perfluoroalkyl surfactant and 5.2 mg/m$^2$ of SODEVCLEAN. The first layer contains no binder, since it only functions as a coatability improvement. The second layer contains 71% of the total binder amount. Additionally 82% of the Helioechtscharz AG was incorporated in this layer. The TiO$_2$ and surfactants were incorporated in the third layer together with the resulting gelatin and Helioechtschwarz AG.

To obtain the preferred swelling characteristics, the first layer was adjusted to pH 5.6, the second to 3.0 and the third layer to pH 5.4. After coating, the package was chilled for 15 seconds at 5° C., dried on a temperature of 450° C. for at least 4 minutes. For the TiO$_2$, BAYERTITAN RKB2, commercially available at Bayer, was used. TERGITOL 4 is an anionic surfactant, commercially available at Union Carbide. Helioechtschwarz AG is a carbon black with an average particle size of 150–250 $\mu$m. Prior to addition to the coating solution, a dispersion is made with a part of the gelatin used in the coating solution.

Helioechtschwarz AG is commercially available at BASF. SAPONIN is a nonionic surfactant mixture consisting of esters and polyglycosides, commercially available at Merck. 1,3,5-triacrylonyl-perhydro-S-triazin is used as a hardening catalyst, commercially available at PCAS. SYLOID 378 is amorphous silica, commercially available at Grace. SODEVCLEAN is a mixture of surfactants, commercially available at SPECHIM.

Receiving Layer:

The same layer as in example 1 was applied.

Imaging the Plates

In a XANTHÉ PLATEMAKER II™ the receiving side of the materials is imaged with a screen of horizontal and vertical lines, together with some image planes to obtain a minimum tack of the ink to the plate during printing, comparable to practical usage of offset printing plates.

Method Plate Slippage Determination on Press

To an AB DICK 9860 a setting with a fast video system is made to register the plate slippage while printing. For a camera, a high Speed Videorecorder type HSV 400, commercially available at NAC, was used at a speed of 400 images/second.

Operating Procedure

A reference line is put on the printing plate by drawing a line with a thin style near the clamp (see FIG. 1). The distance between the clamp and this line will later function as nulpoint at the calculus of the plate slippage.

Camera and press are started simultaneously. The press is stopped just before the plate shoot out of the clamp. This is noticeable because the dark bar below in the copies is moved until on the margin of the paper. The time of the video system and the number of printed copies is noted. Hereby it is possible to link afterwards the images to the number of copies.

Analysis of the Images (see FIG. 1)

On image 1 the distance is measured between raster line 1 and raster line 2. This is separately measured with a ruler on the printing plate. Hereby the enlargement factor can be calculated.

Afterwards on image 1 the distance between the clamp edge and the reference line is measured on the monitor by means of a coordination system. This is repeated for the prints 25-50-100-250-500. From these measurements, the distance between clamp and reference line, measured on image 1, is subtracted.

After multiplication of these distances with the enlargement factor, the real distances which the plate shoot out in comparison with print 1 are obtained.

Calculation Plate Slippage

The measured distances of plate slippage were plotted versus the run length. To this curve, a line can be fitted following the equation: plate slippage=a.x+b. In this equation, x means number of prints, 'a' corresponds to the slipping sensitivity during printing. We found that 'b' corresponds to the plate slippage occurring during the first prints, caused by bending of the plate or other mounting defects of the plate.

Results:

On an AB DICK 9860 the above mentioned examples were tested. In example 1.1 and example 2 the printing plate was mounted on the printing press without any way of moistening the backing side of the plate. In the other examples, the plates were moistened by transporting the plate through a CP38 processor, filled with distilled water, just before mounting the plate on the printing cylinder of the press. The used printing speed was 6000 prints/hour and AB DICK 1020 ink was used together with following fountain: AB DICK 1114 7.5%+15% isopropanol at pH:=5.8. A CP38 is a COPYPROOF® processor, commercially available at Agfa.

| | Slope a | Intercept b | Ra $\mu$m | WA g/m$^2$ | ([WA]$^2$)/ Ra |
|---|---|---|---|---|---|
| Comparative Ex 1.1 | 0.093 | 1.048 | 0.31 | 1.2 | 4.6 |
| Comparative Ex 1 | 0.089 | 0.182 | 0.31 | 1.2 | 4.6 |
| Ex 2 | 0.075 | 0.771 | 0.14 | 4.0 | 114 |
| Ex 3 | 0.085 | 0.662 | 0.21 | 1.9 | 17 |
| Ex 4 | 0.074 | 0.992 | 0.26 | 2.6 | 26 |
| Ex 5 | 0.059 | −0.500 | 0.20 | 2.4 | 30 |
| Ex 6 | 0.038 | −0.593 | 0.50 | 6.7 | 90 |
| Ex 7 | 0.017 | 0.053 | 0.24 | 5.1 | 108 |
| Ex 8 | 0.006 | 0.371 | 0.52 | 8.3 | 131 |

What is claim is:

1. An imaging element for making a lithographic printing plate, comprising on a first side of a flexible support a surface capable of being differentiated in oleophilic and oleophobic areas upon imaging and on a second side opposite to said first side a layer or a package of layers, wherein said layer or package of layers on the backside has a ratio of the squared value of the gravimetric water absorption (WA) in g/m² over the mean roughness in μm greater than 20.

2. An imaging element according to claim 1 wherein the ratio of the squared value of the gravimetric water absorption over the mean roughness is greater than 30.

3. An imaging element according to claim 1 wherein said mean roughness ranges between 0.03 and 1 μm.

4. An imaging element according to claim 3 wherein said mean roughness ranges between 0.05 and 0.80 μm.

5. An imaging element according to claim 1 wherein said water absorption ranges between 1.5 and 15 g/m².

6. An imaging element according to claim 5 wherein said water absorption ranges between 2 and 10 g/m².

7. A method wherein an imaging element according to claim 1 is exposed and if necessary developed to a printing plate.

8. A method according to claim 7 wherein said printing plate is moistened before printing.

9. A method according to claim 7 wherein the second side of said printing plate is moistened before printing.

* * * * *